United States Patent [19]
Gardner et al.

[11] Patent Number: 6,051,865
[45] Date of Patent: Apr. 18, 2000

[54] TRANSISTOR HAVING A BARRIER LAYER BELOW A HIGH PERMITTIVITY GATE DIELECTRIC

[75] Inventors: Mark I. Gardner, Cedar Creek; Mark C. Gilmer; Derick J. Wristers, both of Austin, all of Tex.

[73] Assignee: Advanced Micro Devices, Inc., Sunnyvale, Calif.

[21] Appl. No.: 09/189,352

[22] Filed: Nov. 9, 1998

[51] Int. Cl.$^7$ .................................................. H01L 29/78
[52] U.S. Cl. .................... 257/411; 257/310; 257/639; 257/649
[58] Field of Search .................... 257/410, 411, 257/310, 392, 639, 649; 438/216, 217, 769, 775, 282, 786

[56] References Cited

U.S. PATENT DOCUMENTS

| | | | |
|---|---|---|---|
| 4,266,985 | 5/1981 | Ito et al. | 257/369 |
| 4,642,878 | 2/1987 | Maeda . | |
| 4,738,934 | 4/1988 | Johnston, Jr. et al. . | |
| 5,064,775 | 11/1991 | Chang . | |
| 5,284,795 | 2/1994 | Gay et al. . | |
| 5,362,667 | 11/1994 | Linn et al. | 437/62 |
| 5,420,056 | 5/1995 | Moslehi . | |
| 5,528,068 | 6/1996 | Ohmi | 257/411 |
| 5,554,871 | 9/1996 | Yamashita et al. | 257/336 |
| 5,557,129 | 9/1996 | Oda et al. | 257/345 |
| 5,580,800 | 12/1996 | Zhang et al. . | |
| 5,596,218 | 1/1997 | Soleimani et al. | 257/369 |
| 5,808,348 | 9/1998 | Ito et al. | 257/410 |
| 5,821,172 | 10/1998 | Gilmer et al. | 438/769 |
| 5,858,843 | 1/1999 | Doyle et al. | 438/299 |
| 5,861,335 | 1/1999 | Hause et al. . | |
| 5,882,993 | 3/1999 | Gardner et al. | 438/591 |
| 5,891,798 | 4/1999 | Doyle et al. | 438/624 |

*Primary Examiner*—David Hardy
*Attorney, Agent, or Firm*—Kevin L. Daffer; Conley, Rose & Tayon

[57] ABSTRACT

A transistor and a method for making a transistor are described. Barrier species such as nitrogen may be introduced into a semiconductor substrate to form a barrier layer. A dielectric having a high dielectric constant, preferably a metal- and oxygen-bearing dielectric, may then be deposited upon the semiconductor substrate. The barrier layer preferably mitigates short channel effects and prevents dopant and/or metal atom migration into or out of the gate structure. The dielectric may be annealed in an oxygen-bearing atmosphere to passivate the dielectric material and to incorporate barrier species into the dielectric. Alternatively, the anneal may be performed in an inert atmosphere. Following deposition of a conductive gate material upon the dielectric, a gate conductor and gate dielectric may be patterned. Lightly doped drain impurity areas and/or source and drain impurity areas may then be formed in the semiconductor substrate.

15 Claims, 4 Drawing Sheets

TRANSISTOR HAVING A BARRIER LAYER BELOW A HIGH PERMITTIVITY GATE DIELECTRIC

BACKGROUND OF THE INVENTION

1. Field of the Invention

This invention relates to integrated circuit fabrication and, more particularly, to fabricating a transistor having a high-quality gate dielectric with a high dielectric constant. The transistor further includes barrier species incorporated into the channel region as well as the gate dielectric to provide a diffusion barrier.

2. Description of the Related Art

Fabrication of a MOSFET device is well known. Generally speaking, MOSFETs are manufactured by placing undoped polycrystalline silicon ("polysilicon") over a relatively thin layer of silicon dioxide. The polysilicon material is then patterned to form a gate conductor with source/drain regions adjacent to and on opposite sides of the gate conductor. The gate conductor and source/drain regions are subsequently implanted with an impurity dopant species. If the impurity dopant species used for forming the source/drain regions are n-type, then the resulting MOSFET is an NMOSFET ("n-channel") transistor device. Conversely, if the source/drain dopant species is p-type, then the resulting MOSFET is a PMOSFET ("p-channel") transistor device. Integrated circuits utilize either n-channel devices exclusively, p-channel devices exclusively, or a combination of both on a single substrate.

Because of the increased desire to build faster and more complex integrated circuits, it has become necessary to reduce the transistor threshold voltage, $V_T$, necessary to activate the transistor. Several factors contribute to $V_T$, one of which is the gate-to-substrate capacitance. The higher the gate-to-substrate capacitance, the lower the $V_T$ of a transistor. The value of this capacitance is dependent upon the thickness of the gate dielectric and the relative permittivity of the gate dielectric. Unfortunately, the relative permittivity, or dielectric constant, K, of the gate dielectric limits the amount of gate-to-substrate capacitance that can be achieved when a transistor is in operation. Permittivity, $\epsilon$, of a material reflects the ability of the material to be polarized by an electric field. The capacitance between two layers of conductive material separated by a dielectric is directly proportional to the permittivity of the dielectric. The permittivity of a material is typically described as its permittivity normalized to the permittivity of a vacuum, $\epsilon_o$. Hence, the relative permittivity or dielectric constant of a material is defined as:

$$K = \epsilon/\epsilon_o$$

Silicon dioxide is widely used as the gate dielectric material (or "gate oxide") in semiconductor devices. Silicon dioxide has a relatively low K of approximately 3.7 to 3.8. As such, the minimum value of $V_T$, and thus the transistor switching speed, must be somewhat related to capacitive coupling between the gate conductor and the substrate.

As mentioned above, the gate-to-substrate capacitance is also affected by the thickness of the gate dielectric. Conventional transistors typically include an ultra-thin gate oxide to increase the gate-to-substrate capacitance, and thereby lower $V_T$. The value of the gate-to-source voltage, $V_{GS}$, required to invert the channel underneath the gate conductor such that a given drive current, $I_D$, flows between the source and drain regions of the transistor is decreased. Equivalently, the value of $I_D$ for a given value of $V_T$ increases with decreasing gate dielectric thickness. Consequently, the switching speed (from off to on and vice versa) of the logic gates of an integrated circuit employing transistors with narrow gate dielectrics increases, allowing the integrated circuit to quickly transition between logic states (i.e., operate at high frequencies). In addition, thin gate dielectrics advantageously control short channel effects by permitting the gate to retain control of the channel charge.

The use of very thin silicon dioxide gate dielectrics, however, may present several potential problems. Thin silicon dioxide films may break down when subjected to an electric field. Particularly, for a gate oxide that is less than 50 angstroms thick, it is probable that when $V_{GS}$ is equivalent to only 3 V, electrons can pass through the gate oxide by what is known as the quantum mechanical tunneling effect. In this manner, a tunneling current may undesirably form between the semiconductor substrate and the gate conductor, adversely affecting the operability of the device. It is postulated that these electrons may become entrapped within the gate oxide by, e.g., dangling bonds. As a result, a net negative charge density may form in the gate oxide. As the trapped charge accumulates with time, $V_T$ may shift from its design specification. Breakdown of the gate oxide may also occur at even lower values of $V_{GS}$, as a result of defects in the gate oxide. Because it is at present difficult to grow very thin gate dielectric oxides precisely and uniformly across a semiconductor substrate and from wafer to wafer, such defects are unfortunately prevalent in relatively thin gate oxides. For example, a thin gate oxide often contains pinholes and/or localized voids due to unevenness at which the oxide grows on a less than perfect silicon lattice. The gate oxide must also be resistant to breakdown and hot-carrier damage. Low breakdown voltages also correlate with high defect density near the surface of the substrate. Further, in p-channel devices, the gate oxide needs to be resistant to penetration by boron at the processing temperatures used after gate doping.

Another factor that may contribute to $V_T$ is the effective channel length of the transistor, $L_{eff}$. $L_{eff}$ is the actual distance between the source-side and drain-side junctions after implantation and subsequent diffusion and is typically less than the physical channel length. Reducing the $L_{eff}$ of a transistor to below 1.0 $\mu$m may lead to deleterious short channel effects ("SCE"). Generally speaking, SCE impacts device operation by, for example, increasing sub-threshold currents. A problem related to SCE and the subthreshold currents associated therewith is the problem of hot-carrier effects ("HCE"). HCE is a phenomenon by which the kinetic energy of the charge carriers (holes or electrons) is increased as the carriers are accelerated through large potential gradients and subsequently become trapped within the gate oxide. The greatest potential gradient, often referred to as the maximum electric field ("$E_m$"), occurs near the drain during saturated operation of a transistor.

More specifically, the electric field is predominant at the lateral junction of the drain adjacent the channel. As hot electrons travel to the drain, they lose their energy by a process called impact ionization. Impact ionization serves to generate electron-hole pairs that migrate to and become injected within the gate dielectric near the drain junction. Vacancy and interstitial positions within the gate dielectric generally become electron traps, resulting in a net negative charge density within the gate dielectric. Unfortunately, the trapped charge may accumulate over time, causing the transistor threshold voltage to undesirably shift from its design specification. It is known that since hot electrons are more mobile than hot holes, HCE causes a greater threshold skew in NMOS transistors than PMOS transistors. Nonetheless, a PMOS transistor will undergo negative threshold skew if its $L_{eff}$ is less than, e.g., 0.8 μm.

It would therefore be desirable to develop a technique for fabricating a transistor with increased resistance to short channel effects and hot carrier effects. It would further be desirable to develop a technique for fabricating a transistor with increased gate-to-substrate capacitance that is substantially resistant to gate dielectric breakdown. Fabrication of a relatively thin gate oxide interposed between the gate and the substrate must be avoided. A transistor with the immediately preceding advantages must also switch on and off quickly, thereby providing for high frequency operation of an integrated circuit. The likelihood of forming a tunneling current between the gate dielectric and the gate conductor of the resulting transistor should also be reduced, as should the possibility of electrons becoming trapped within the gate dielectric. Such a transistor should be substantially resistant to threshold skews from the desired value of $V_T$.

SUMMARY OF THE INVENTION

The problems outlined above are in large part solved by the technique hereof for fabricating a transistor in which the gate dielectric includes a material having a relatively high dielectric constant, K. The gate-to-substrate capacitance, being directly proportional to K, is thus increased, causing a decrease in the transistor threshold voltage, $V_T$. As a result, an integrated circuit employing such transistors can more quickly transition between logic states. Further, the increase of the gate-to-substrate capacitance can be accomplished advantageously without resorting to decreasing the gate dielectric thickness. In other words, a thicker gate dielectric can be used to achieve the same $V_T$ as compared to using a silicon dioxide gate dielectric. Therefore, the probability that the gate dielectric will break down is significantly reduced. In this manner, problems such as current passing through the gate dielectric and electron entrapment within the gate dielectric are less likely to be encountered.

Frequently, the gate dielectric layer is formed directly upon a semiconductor substrate. Typically, the semiconductor substrate is single crystalline silicon. The oxygen present in the dielectric materials of the present invention, however, may be sufficient to oxidize underlying portions of the silicon. As such, a barrier layer is preferably formed prior to formation of the gate dielectric layer to prevent oxidation of the substrate.

According to an embodiment of the invention, barrier atoms may be incorporated into the semiconductor substrate by, e.g., ion implantation. In an embodiment, the barrier species may include a nitrogen-containing species such as N or $N_2$. Alternatively, the barrier species may include, e.g., a noble gas, such as argon. The barrier species may be implanted at a concentration and energy such that a peak concentration of barrier species within the substrate is located substantially between about 50 angstroms and about 200 angstroms, and preferably about 100 angstroms, below the upper surface of the substrate.

In an embodiment, an implant oxide layer may be formed upon the upper surface of the semiconductor substrate prior to implantation of the barrier species. The implant oxide may protect the substrate from contamination by impurities during implantation of the barrier layer and/or reduce channeling within the substrate by implanted ions. The implant oxide may include silicon dioxide that has been, e.g., thermally grown or deposited from a silane- and oxygen-bearing plasma to a thickness substantially between about 50 angstroms and about 250 angstroms. Preferably, the thickness of the implant oxide is such that the peak concentration of the barrier species is located proximate the interface between the substrate and the implant oxide following implantation of the barrier species. Following implantation of the barrier species, the implant oxide may be stripped from the upper surface of the substrate. It should be noted that although the term "implant oxide" has been used to refer to this layer, a non-oxide material such as silicon nitride or photoresist may be used to form the implant oxide.

A low-temperature oxidation may be used to produce an optional layer of barrier species-bearing oxide upon the substrate upper surface. The barrier species-bearing oxide is preferably formed following introduction of the barrier species into the semiconductor substrate. Formation of the barrier species-bearing oxide may further increase the concentration of barrier atoms proximate the gate dielectric of the transistor and concurrently decrease the probability of oxidation of the underlying substrate by oxygen in the gate dielectric. If an implant oxide is utilized, the barrier species-bearing oxide is preferably formed following removal of the implant oxide.

A high-K gate dielectric layer (i.e., a layer of a dielectric material having a K value greater than about 3.7–3.8, the K value of silicon dioxide) may then be formed upon the barrier layer (or the optional barrier species-bearing oxide). The gate dielectric material may include a compound material. For purposes of this application, a "compound material" is defined as a material including atoms of at least two different chemical species, one of which is oxygen and the other of which is a metal. Examples of high-K gate dielectric materials include barium strontium titanate (BST), tantalum oxide ($Ta_2O_5$), and titanium dioxide ($TiO_2$).

The gate dielectric layer may be formed using, for example, chemical vapor deposition (CVD) or sputtering. In an embodiment, the gate dielectric layer is formed using metal organic CVD (MOCVD), in which a heat-decomposable compound (an organometallic in the case of MOCVD, referred to as the "source reagent") is contacted with a substrate that has been heated to a temperature above the decomposition temperature of the source reagent. The source reagent decomposes to deposit the element or metal on the substrate. By using more than one source reagent and adjusting the deposition parameters, deposition of compound materials is possible. It is possible with this process to control the concentration ratio of the reactants in the reaction gases and crystallinity of the reaction product by changing the film-forming conditions, such as the flow rate of the reaction gases, gas flow mode, or substrate temperature. Control of key variables such as stoichiometry and film thickness and coating of a wide variety of substrate geometries are generally possible with MOCVD.

Following formation of the gate dielectric layer, an anneal in an oxygen-bearing ambient may be performed to passivate the dielectric material. Oxygen introduced into the gate dielectric material may advantageously complete the bond structure of the metal-oxygen compounds, giving a film with improved dielectric qualities. Alternatively, the anneal may be performed in an inert environment (e.g., in a nitrogen-containing ambient) to farther enhance the concentration of barrier species proximate the gate dielectric-substrate interface.

A conductive gate material may then be formed upon the gate dielectric material. In an embodiment, the gate conductor includes a material such polycrystalline silicon ("polysilicon"). Alternatively, the conductive gate material may include a second compound material different from the first compound material of the gate dielectric layer. A compound material may be used as the conductive gate material to avoid the formation of oxygen vacancies at the interface between the conductive and dielectric materials when the dielectric material includes oxygen.

Following formation of the conductive gate layer, a gate stack may be patterned using the well-known photolithography process. A photoresist may be deposited upon the conductive gate material using, e.g., chemical vapor deposition and then selectively patterned and removed from above portions of the conductive gate material. Portions of the conductive gate material and the underlying gate dielectric material not masked by the remaining photoresist may be removed using, e.g., an anisotropic dry plasma etch to form a gate conductor upon a gate dielectric.

Dopant ions may then be introduced (e.g., by ion implantation) into the semiconductor substrate to form lightly doped drain areas self-aligned with sidewall surfaces of the gate conductor. Following formation of the lightly doped drains, a conformal dielectric material may be deposited across the gate structure and exposed portions of the semiconductor substrate. An anisotropic etch may then be used to preferentially remove portions of the spacer conformal dielectric from upon substantially horizontal surfaces of the semiconductor topography while retaining the conformal dielectric material adjacent substantially vertical surfaces. The retained material preferably forms spacers adjacent sidewall surfaces of the gate structure. Following spacer formation, a second impurity distribution having may be introduced (e.g., by ion implantation) into the semiconductor substrate at a concentration and energy greater than the lightly doped drain impurity distribution to form source and drain impurity areas self-aligned with sidewall surfaces of the spacers.

BRIEF DESCRIPTION OF THE DRAWINGS

Other objects and advantages of the invention will become apparent upon reading the following detailed description and upon reference to the accompanying drawings in which.

Figure 1A:
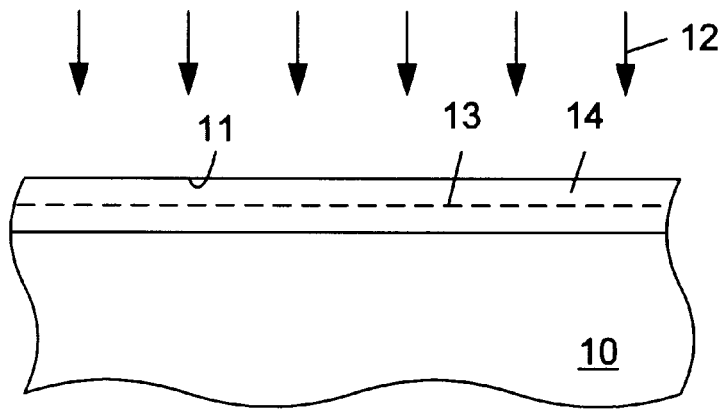
FIG. 1a depicts a partial cross-sectional view of a semiconductor topography according to an embodiment of the present invention, wherein barrier species are introduced into a semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1a depicts a semiconductor substrate 10 into which barrier atoms 12 have been introduced. Semiconductor substrate 10 may include single crystalline silicon. Dielectric isolation regions (not shown) may be formed within semiconductor substrate 10 arranged a spaced distance apart for dielectrically isolating ensuing active areas of the semiconductor substrate. Preferably, substrate 10 is slightly doped with n-type or p-type impurities.

Preferably, barrier atoms 12 form a barrier layer 14 within substrate 10. In an embodiment, the barrier atoms may include nitrogen. For example, barrier atoms 12 may include N or $N_2$ implanted into semiconductor substrate 10 at a concentration between about $5 \times 10^{13}$ $cm^{-2}$ and about $1 \times 10^{15}$ $cm^{-2}$ and at an energy between about 500 eV and 20 keV. Alternatively, barrier atoms 12 may include, e.g., a noble gas such as argon. According to an embodiment, the implant energy and concentration may be such that a peak concentration of barrier atoms in layer 14, indicated by dotted line 13, is between about 50 angstroms and about 200 angstroms, and more preferably about 100 angstroms, below upper surface 11 of semiconductor substrate 10. During subsequent annealing, the peak barrier species concentration 13 will preferably migrate toward upper surface 11 of semiconductor substrate 10. As such, damage caused by the implant may be annealed out, and a higher nitrogen concentration may accumulate proximate the gate dielectric to be formed upon the substrate.

Barrier layer 14 may confer several potential advantages to the subsequently formed transistor. The barrier layer preferably acts as an oxidation buffer to prevent oxidation of portions of semiconductor substrate 10 underlying the gate dielectric that will be formed thereon. Barrier layer 14 also preferably minimizes hot carrier injection into the gate from the junction areas. In addition, the barrier layer preferably prevents migration of mobile species, such as boron implanted during doping of the gate conductor or junction formation, from the gate into the underlying channel region. Finally, barrier species may also stop migration of metal contaminants introduced into the substrate during, e.g., isolation dielectric formation.

Figure 1B:
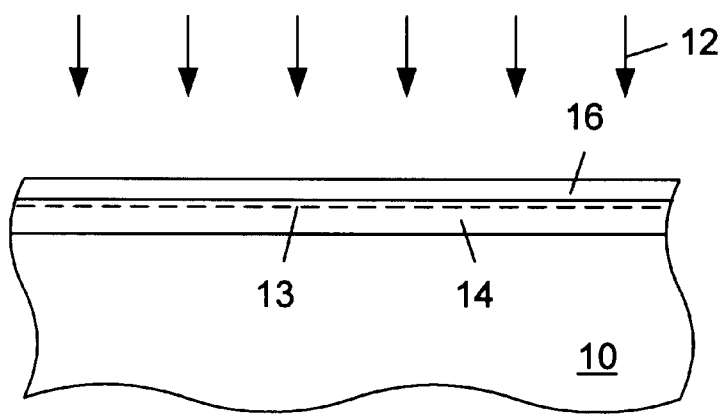
FIG. 1b depicts a partial cross-sectional view of the semiconductor topography according to an alternative embodiment in which an implant oxide is formed upon an upper surface of the semiconductor substrate prior to introduction of the barrier species.

According to an optional embodiment, an implant oxide layer 16 may be formed upon upper surface 11 of semiconductor substrate 10 prior to introduction of barrier species into the substrate, as shown in FIG. 1b. Alternatively, although layer 16 is designated as an "implant oxide" layer, it may include a non-oxide material such as silicon nitride or photoresist. Implant oxide layer 16 preferably is removed from upper surface 11 following formation of barrier layer 14. Preferably, implant oxide 16 is formed to a thickness of between about 50 angstroms and about 200 angstroms. As such, a peak concentration 13 of barrier atoms in barrier layer 14 may reside at or near the surface of substrate 10 after removal of the implant oxide. Implant oxide 16 may facilitate shallow implantation of the barrier species when a high-energy implant is used. That is, in the absence of the implant oxide, a high-energy implanter may position the peak barrier species concentration unacceptably deeply within the substrate.

Figure 2A:
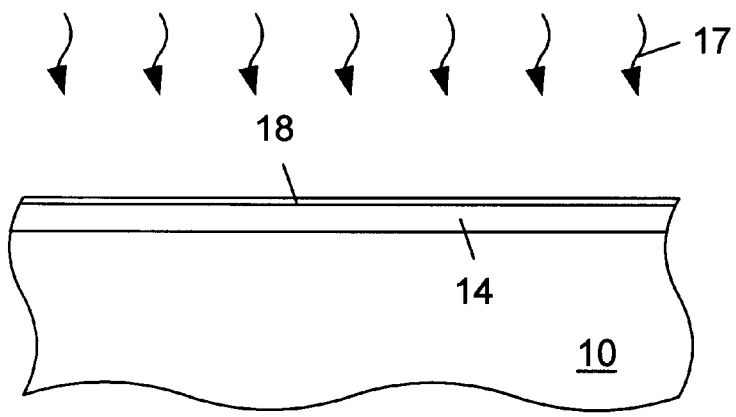
FIG. 2a depicts a partial cross-sectional view of the semiconductor topography subsequent to FIG. 1a or 1b in which a barrier-entrained oxide is formed upon the upper surface of the semiconductor substrate.

According to an optional embodiment shown in FIG. 2a, a low-temperature oxidation 17 of the upper surface of semiconductor substrate 10 may be performed to form a thin layer 18 of barrier species-bearing oxide. Thin oxide 18 may be formed by exposing the substrate to an oxidizing ambient in a rapid thermal annealer for about 10–40 s at a temperature between about 700° C. and about 900° C. Preferably, thin oxide 18 is formed to a thickness of between about 4 angstroms and about 8 angstroms. The presence of the barrier species advantageously retards the oxidation rate of the substrate, allowing formation of the thin oxide. Forming thin oxide 18 preferably anneals out damage to the substrate cause by introduction of the barrier species. In addition, the presence of thin oxide 18 preferably increases the concentration of barrier species at the substrate surface. For simplicity, oxide layer 18 is not depicted in subsequent figures. It is to be understood, however, that layer 18 may be present.

Figure 2B:
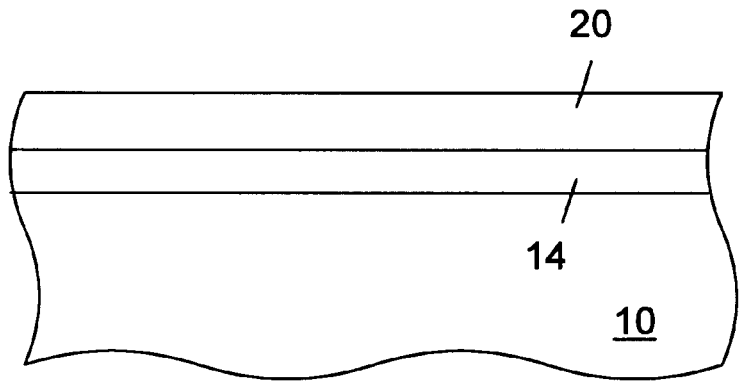
FIG. 2b depicts a partial cross-sectional view of the semiconductor topography subsequent to 1a, 1b, or 2a, in which a dielectric material is formed upon the upper surface of the semiconductor substrate.

As shown in FIG. 2b, a layer of a dielectric material 20 may then be formed across the upper surface of semiconductor substrate 10 (or, if present, of oxide layer 18). Preferably, dielectric material 20 has a dielectric constant greater than a dielectric constant of silicon dioxide (i.e., greater than about 3.8). Dielectric material 20 may include an oxide-bearing material, such as barium strontium titanate, tantalum pentoxide, or titanium dioxide. According to one embodiment, a dielectric constant of layer 20 may be between about 3.8 and about 20. According to an alternative embodiment, the dielectric constant of layer 20 may be between about 20 and about 100. According to a further alternative embodiment, the dielectric constant of layer 20 may be between about 100 and about 1000.

Dielectric layer 20 may be formed using, e.g., chemical vapor deposition ("CVD"), spin-on deposition, or sputtering. In an embodiment, gate dielectric layer 20 may be formed using metal organic CVD. The thickness of dielectric layer 20 may vary, depending somewhat on the dielectric constant of the dielectric material and the desired threshold voltage of the ensuing transistor. For example, a 300-angstrom-thick layer of a dielectric material with a dielectric constant of 115 should have electrical properties approximately equivalent to electrical properties of a silicon dioxide layer about 10 angstroms thick. In an embodiment in which dielectric material 20 is barium strontium titanate (K≈160), layer 20 may be deposited to a thickness substantially between about 50 angstroms and about 100 angstroms.

Figure 3:
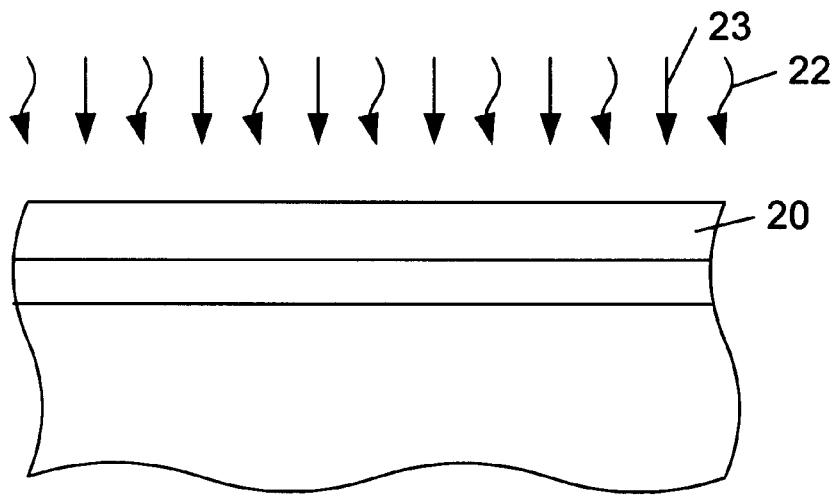
FIG. 3 depicts a partial cross-sectional view of the semiconductor topography subsequent to FIG. 2b in which the dielectric layer is subjected to a passivating anneal.

Turning now to FIG. 3, an anneal in an oxygen-bearing ambient may be performed. According to an embodiment, the anneal may include exposure to thermal radiation 22 and oxygen-bearing species 23 at a temperature of between about 600° C. and about 800° C. in a tube furnace for between about 5 minutes and about 15 minutes. Alternatively, the exposure to radiation 22 and oxygen 23 may be in a rapid thermal anneal chamber at between about 600° C. and about 800° C. for between about 30 seconds and about 90 seconds. Preferably, if dielectric material 20 includes an oxide, the anneal passivates the dielectric material by tying up loose bonds and completing the bond structure in the oxide. The annealed dielectric should exhibit improving film quality and reduced charge trapping. Alternatively, oxygen-bearing species 23 may be omitted, and the anneal may be performed in an inert (e.g., nitrogen-containing) ambient by rapid thermal annealing for about 10–40 seconds at between about 700° C. and about 900° C.

Figure 4:
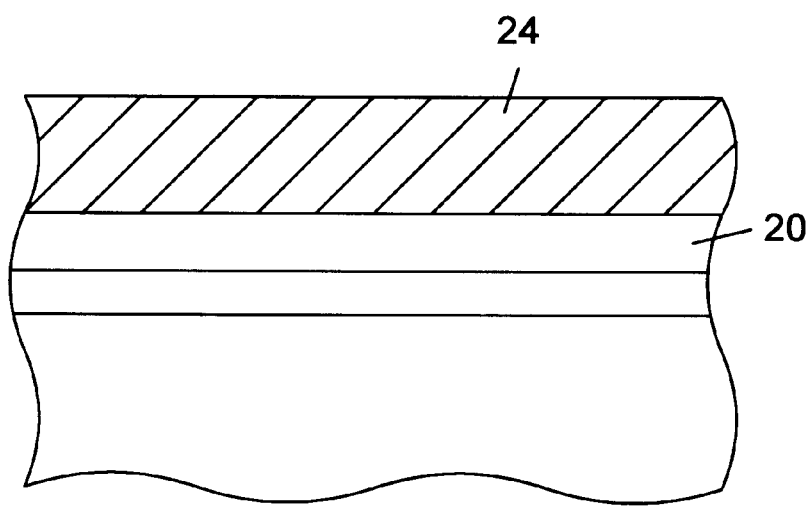
FIG. 4 depicts a partial cross-sectional view of the semiconductor topography subsequent to FIG. 3 in which a gate conductive material is formed upon the dielectric layer.
Figure 5:
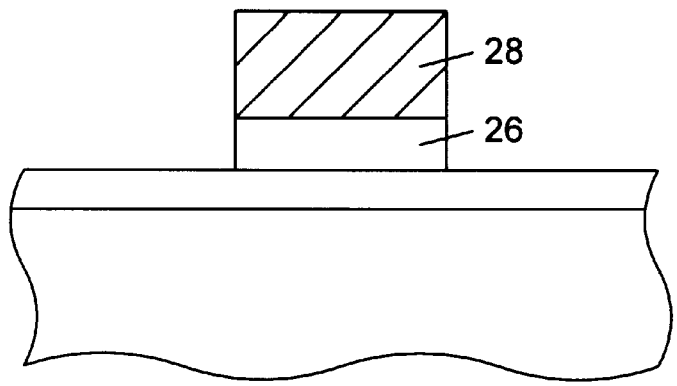
FIG. 5 depicts a partial cross-sectional view of the semiconductor topography subsequent to FIG. 4 in which the conductive gate material and the dielectric layer are patterned to form a conductive gate structure.

A conductive gate material may then be deposited upon dielectric layer 20, as shown in FIG. 4. Preferably, conductive gate material 24 includes polysilicon. Conductive gate material 24 and gate dielectric material 20 may be selectively patterned using photolithography techniques well known in the art to form gate conductor 28 upon gate dielectric 26, as shown in FIG. 5.

Figure 6:
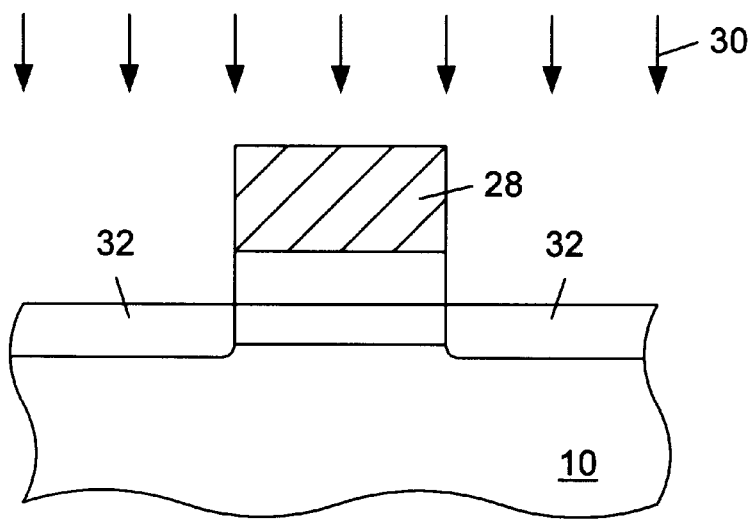
FIG. 6 depicts a partial cross-sectional view of the semiconductor topography subsequent to FIG. 5 in which lightly doped drain impurity areas are formed aligned with sidewall surfaces of the gate structure.

Dopant impurity regions 32 may then be formed aligned with sidewall surfaces of gate conductor 28, as shown in FIG. 6. In an embodiment, impurity ions 30 may be implanted into semiconductor substrate 10 at a concentration of between about $8\times10^{14}$ cm$^{-2}$ and about $5\times10^{15}$ cm$^{-2}$ and an energy between about 600 eV and about 5 keV to form lightly doped drain ("LDD") impurity areas. According to an alternative embodiment, dopants 30 may be implanted at a concentration of between about $5\times10^{15}$ cm$^{-2}$ and about $2\times10^{16}$ cm$^{-2}$ and an energy of between about 800 eV and about 5 keV to form source and drain impurity areas. Examples of suitable dopant ions include arsenic and antimony if an n-type transistor is to be formed and boron if a p-type transistor is to be formed.

Figure 7:
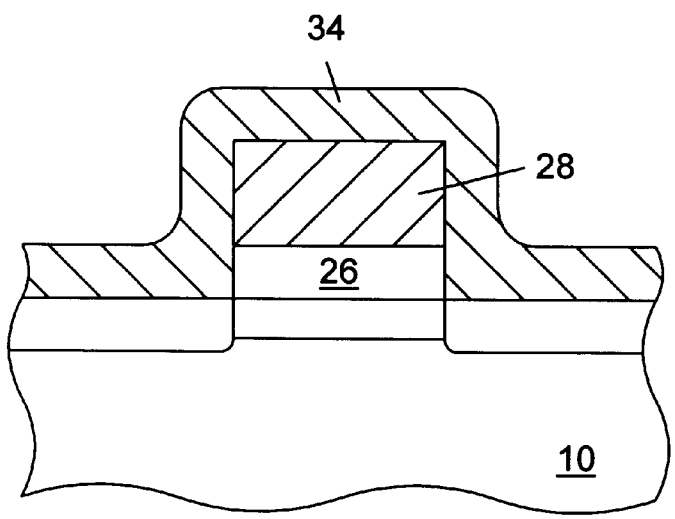
FIG. 7 depicts a partial cross-sectional view of the semiconductor topography subsequent to FIG. 6 in which a spacer dielectric is deposited across the conductive gate structure.
Figure 8:
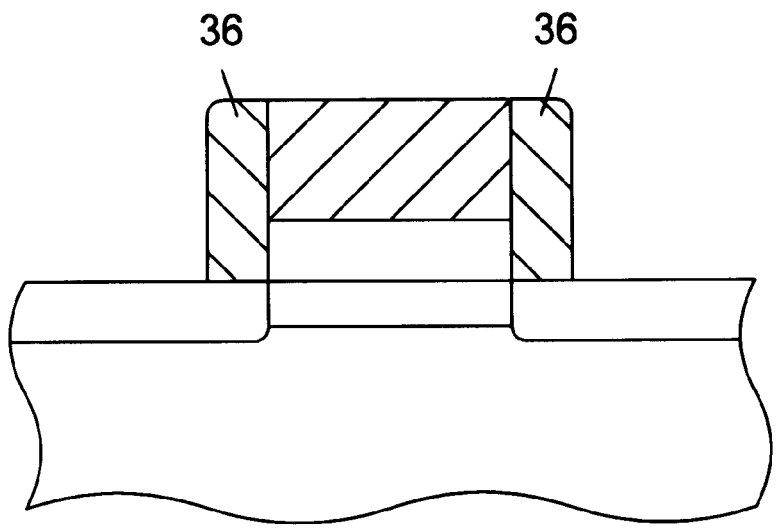
FIG. 8 depicts a partial cross-sectional view of the semiconductor topography subsequent to FIG. 7 in which the spacer dielectric is patterned to form spacers adjacent sidewall surfaces of the conductive gate structure.
Figure 9:
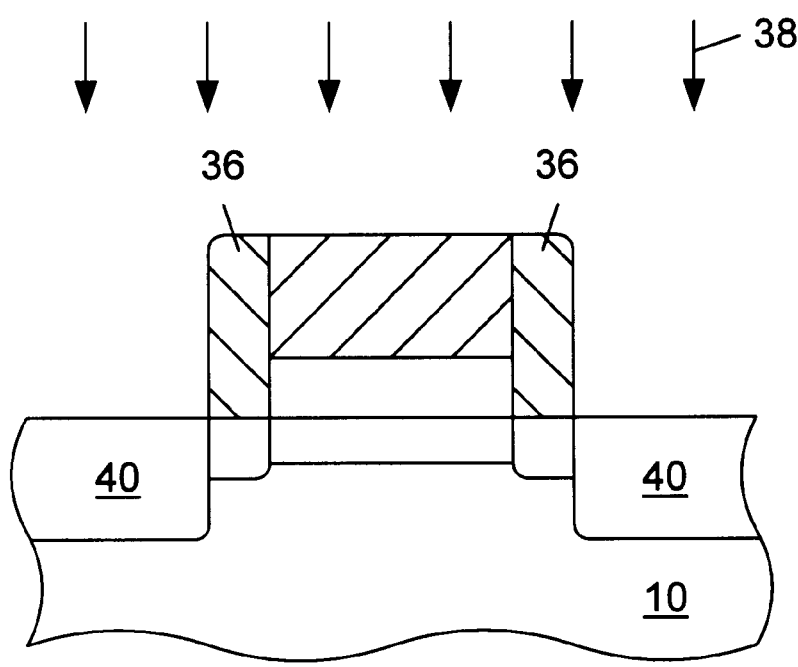
FIG. 9 depicts a partial cross-sectional view of the semiconductor topography subsequent to FIG. 8 in which source and drain impurity areas are formed laterally aligned with sidewall surfaces of the spacers.

If impurity areas 32 are LDD areas, a spacer dielectric material 34 may be deposited across gate conductor 28, gate dielectric 26, and the upper surface of substrate 10, as shown in FIG. 7. In an embodiment, spacer dielectric 34 may include a material such as silicon dioxide, silicon nitride, or silicon oxynitride. Spacer dielectric 34 may be anisotropically etched such that dielectric material is preferentially removed from substantially horizontal surfaces while being retained adjacent substantially vertical surfaces to form spacers 36, as shown in FIG. 8. Source and drain impurity areas 40, depicted in FIG. 9, may then be formed by, e.g., implanting dopant ions 38 into semiconductor substrate 10 aligned with sidewall surfaces of spacers 36. Dopants 38 may be implanted at a concentration of between about $5\times10^{15}$ cm$^{-2}$ and about $2\times10^{16}$ cm$^{-2}$ and an energy of between about 800 eV and about 5 keV to form source and drain impurity areas 40. Examples of suitable dopant ions include arsenic and antimony for an n-type transistor is to be formed and boron for a p-type transistor.

It will be appreciated to those skilled in the art having the benefit of this disclosure that this invention is believed to provide a method for forming a transistor having increased resistance to short channel effects and hot carrier effects. It will be further appreciated to those skilled in the art having the benefit of this disclosure that this invention is believed to provide a method for forming a transistor having reduced gate-to-substrate capacitance that is substantially resistant to gate dielectric breakdown. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A transistor comprising:
   a gate conductor spaced above a semiconductor substrate by a gate dielectric;
   impurity areas aligned with sidewall surfaces of said gate conductor;
   a barrier layer extending below an upper surface of the semiconductor substrate; and
   a barrier species-bearing oxide layer above the barrier layer and below the gate dielectric, wherein the barrier layer comprises nitrogen.

2. The transistor as recited in claim 1 wherein a peak concentration of barrier atoms within said barrier layer is located at a depth between about 50 angstroms and about 200 angstroms below said upper surface.

3. The transistor as recited in claim 1 wherein a peak concentration of barrier atoms within said barrier layer is located at a depth of about 100 angstroms below said upper surface.

4. The transistor as recited in claim 1 wherein said gate dielectric comprises a material having a dielectric constant greater than a dielectric constant of silicon dioxide.

5. The transistor as recited in claim 1 wherein said dielectric constant of said gate dielectric is between about 3.8 and about 20.

6. The transistor as recited in claim 4 wherein said dielectric constant of said gate dielectric is between about 20 and about 100.

7. The transistor as recited in claim 4 wherein said dielectric constant of said gate dielectric is between about 100 and about 1000.

8. The transistor as recited in claim 4 wherein said material comprises a metal- and oxygen-bearing material.

9. The transistor as recited in claim 8 wherein said material comprises a material selected from the group consisting of barium strontium titanate, tantalum pentoxide, and titanium dioxide.

10. The transistor as recited in claim 1 wherein said gate dielectric comprises barrier atoms.

11. The transistor as recited in claim 1 wherein said gate dielectric comprises added oxygen and wherein said added oxygen completes a bond structure of said gate dielectric.

12. The transistor as recited in claim 1 wherein said gate dielectric comprises a densified material.

13. The transistor as recited in claim 1 wherein said impurity areas comprise lightly doped drain impurity areas and further comprising source and drain impurity areas laterally spaced from said gate conductor sidewalls.

14. The transistor as recited in claim 13, further comprising spacers formed upon said semiconductor substrate and laterally adjacent said gate conductor sidewall surfaces.

15. The transistor as recited in claim 1 wherein said impurity areas comprise source and drain impurity areas.

* * * * *